United States Patent
Futakuchiya et al.

(10) Patent No.: US 7,045,747 B2
(45) Date of Patent: May 16, 2006

(54) HEATER UNIT

(75) Inventors: Jun Futakuchiya, Isehara (JP); Toshihiro Tachikawa, Isehara (JP)

(73) Assignee: NHK Spring Co., Ltd., Yokohama (JP)

(*) Notice: Subject to any disclaimer, the term of this patent is extended or adjusted under 35 U.S.C. 154(b) by 0 days.

(21) Appl. No.: 11/042,724

(22) Filed: Jan. 24, 2005

(65) Prior Publication Data

US 2005/0167421 A1    Aug. 4, 2005

(30) Foreign Application Priority Data

Jan. 30, 2004    (JP)    ............ 2004-024233

(51) Int. Cl.
*H05B 3/68*    (2006.01)
*C23C 16/00*    (2006.01)

(52) U.S. Cl. .................... 219/444.1; 118/724

(58) Field of Classification Search ............ 219/443.1, 219/444.1, 546, 547, 548; 118/724, 725, 118/728, 729, 730; 427/585, 587, 588, 592, 427/593

See application file for complete search history.

(56) References Cited

U.S. PATENT DOCUMENTS

| | | | | |
|---|---|---|---|---|
| 5,688,331 | A | * | 11/1997 | Aruga et al. ............ 118/725 |
| 6,160,244 | A | * | 12/2000 | Ohashi ................ 219/444.1 |
| 6,664,515 | B1 | * | 12/2003 | Nakata et al. .......... 219/444.1 |
| 6,878,211 | B1 | * | 4/2005 | Yamaguchi ............ 118/728 |
| 2004/0168641 | A1 | * | 9/2004 | Kuibira et al. .......... 118/728 |

FOREIGN PATENT DOCUMENTS

JP    2003-133195 A    5/2003

* cited by examiner

*Primary Examiner*—Sang Paik
(74) *Attorney, Agent, or Firm*—Frishauf, Holtz, Goodman & Chick, P.C.

(57) ABSTRACT

A heater unit has a heater plate including a resistive heat generator, and a hollow shaft portion of a short type with a length of 20 to 50 mm, which is provide on the side of the lower face of the heater plate. The shaft portion is made from aluminum alloy. The bottom face of the shaft portion is fixed to a heater mounting portion of a casing. A sealing member is provided between the bottom face of the shaft portion and the casing. The thickness of the shaft portion is set to 0.5 to 5.0 mm, and the length, area of heat-transfer surface, and material of the shaft portion are selected such that the thermal resistance $R_{th}$ of the shaft portion is 0.4 K/W or more.

8 Claims, 2 Drawing Sheets

HEATER UNIT

CROSS-REFERENCE TO RELATED APPLICATIONS

This application is based upon and claims the benefit of priority from prior Japanese Patent Application No. 2004-024233, filed Jan. 30, 2004, the entire contents of which are incorporated herein by reference.

BACKGROUND OF THE INVENTION

1. Field of the Invention

The present invention relates to a heater unit which is provided with a heater plate for heating, for example, a semiconductor substrate.

2. Description of the Related Art

In a semiconductor manufacturing process, for example, a heating apparatus for heating a semiconductor substrate accommodated in a process chamber is used. One example of such a heating apparatus is described in Jpn. Pat. Appln. KOKAI Publication No. 2003-133195.

A heating apparatus of this kind has a heater plate which houses a resistive heat generator. A heater plate is maintained at a desired temperature by performing current control on the resistive heat generator. A shaft portion is provided on a lower face side of the heater plate. A bottom face of the shaft portion is fixed to a heater mounting portion of a casing of the heating apparatus.

In the heating apparatus described in the above patent literature, a long size supporting member (corresponding to the shaft portion) is employed in order to reduce temperature fluctuation on a semiconductor placement face. The length of the supporting member is, for example, 250 mm.

In recent years, however, in order to achieve compactness of the semiconductor manufacturing apparatus, there is such a tendency that it is desired to reduce the length of the shaft portion. However, when the length of the shaft portion is reduced, heat of the heater plate easily transfers to a lower portion (a shaft bottom portion) of the shaft portion, so that the shaft bottom portion tends to become a high temperature.

A sealing member (a heat-resistant O-ring) for sealing the casing of the process chamber and the shaft portion with each other is provided on a bottom face of the shaft portion. An excessively high temperature of the shaft bottom portion causes a degradation of the sealing member (the heat-resistant O-ring) provided on the shaft bottom portion or loss of the sealing function thereof. In order to prevent such a drawback, it has been proposed to form a coolant flow path in the vicinity of a heater mounting portion of the casing. A portion of the shaft portion near to the bottom is forcibly cooled by causing coolant to flow in the coolant flow path.

In a short type shaft portion with a length of 50 mm or less, however, heat transfers between the heater plate and the shaft bottom portion more easily compared with a long type shaft portion with a length of more than 50 mm. Therefore, when the shaft bottom portion is cooled excessively, temperature reduction is caused at the central portion of the heater plate or the like, which results in deterioration of temperature evenness of the heater plate. That is, such a problem arises that a semiconductor substrate which is a material to be heated or the like cannot be heated accurately.

BRIEF SUMMARY OF THE INVENTION

In view of these circumstances, an object of the present invention is to provide a heater unit having a short type shaft portion, where a desirable temperature difference can be achieved between the heater plate and the shaft bottom portion.

A heater unit according to the present invention is provided with a heater plate, a shaft portion, and a sealing member. The heater plate is provided with a heat generator and is accommodated inside a casing. The shaft portion is a hollow shaft portion of a short type with a length of 50 mm or less, which is provided on the side of the lower face of the heater plate, and the bottom face thereof is fixed to a heater mounting portion of the casing. The sealing member seals the bottom portion of the shaft portion and the heater mounting portion of the casing with each other. The thickness of a peripheral wall of the shaft portion is set to 0.5 to 5.0 mm, and the length, area of heat-transfer surface, and material of the shaft portion are selected such that the thermal resistance $R_{th}$ (K/W) of the shaft portion becomes 0.4 (K/W) or more. In this specification, "K" represents kelvin, "W" represents watt.

According to the present invention, a desired temperature difference can be achieved between the heater plate and the shaft bottom portion or the lower portion of the shaft portion. Therefore, such an event that high temperature of the heater plate adversely affects the sealing member on the shaft bottom portion can be avoided.

In a preferred embodiment of the present invention, the thermal resistance $R_{th}$ of the shaft portion is set to 0.42 K/W or more. One example of the sealing member is a fluorine-containing heat-resistant O-ring with a continuously usable temperature (temperature limit) of 300° C. or below 300° C. The material for the shaft portion is, for example, aluminum alloy.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

A first embodiment of the present invention will be explained below with reference to FIGS. 1 to 3.

Figure 1:
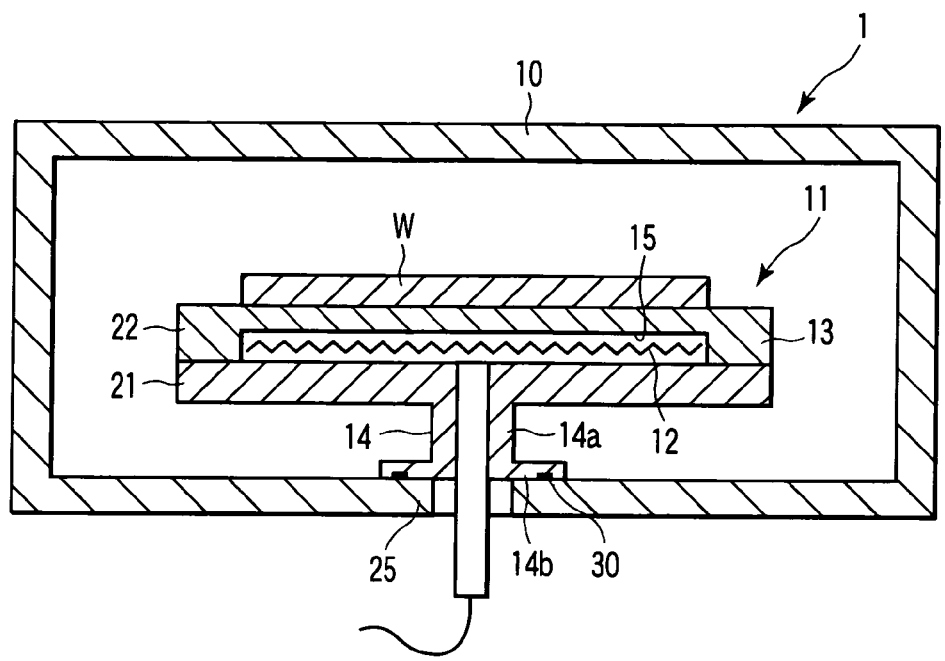
FIG. 1 is a sectional view illustratively showing a processing apparatus provided with a heater unit according to a first embodiment of the present invention.

FIG. 1 illustratively shows a section of a processing apparatus (a process chamber) 1 which is used in a semiconductor manufacturing process. A heater unit 11 which functions as a heating apparatus is accommodated inside a casing 10 of the processing apparatus 1. The casing 10 has such an air-tight structure that the interior thereof can be sealed from the outside (atmosphere).

Figure 2:
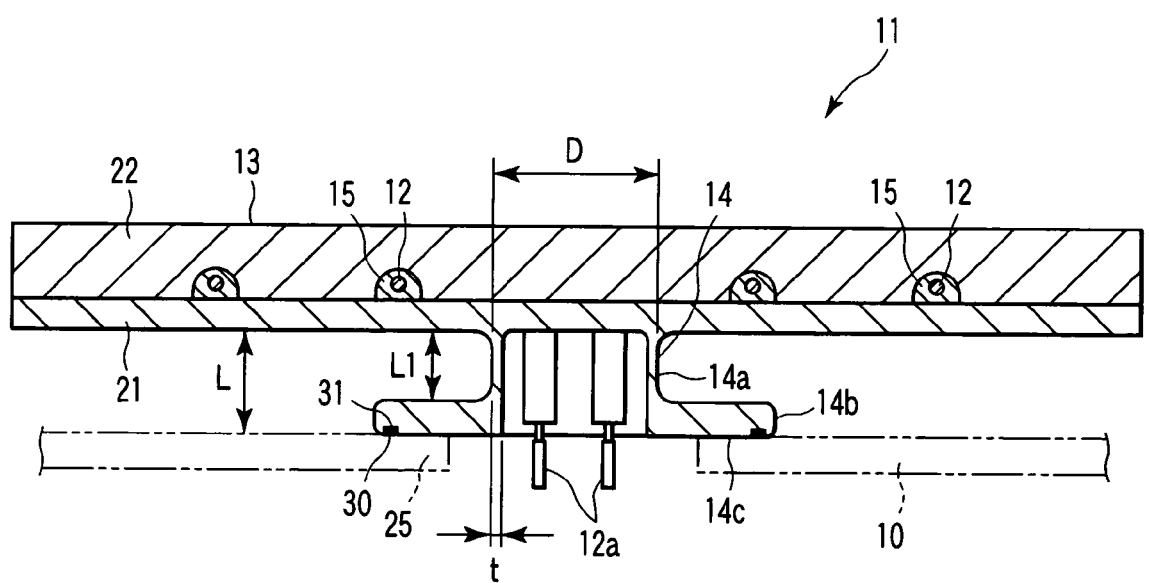
FIG. 2 is a sectional view of the heater unit shown in FIG. 1.

As shown in FIG. 2, the heater unit 11 has a disc-shape heater plate 13 housing a resistive heat generator 12 therein, a hollow shaft portion 14 of a short type with a length of 50 mm or less, which is provided on a side of the lower face of the heater plate 13, and the like. The resistive heat generator 12 which is one example of a heat generator is accommodated in a groove 15 formed on the heater plate 13. A terminal portion 12a of the resistive heat generator 12 is led outside the casing 10 through the inside of the shaft portion 14. One example of a work (a material to be heated) W is a semiconductor wafer for use in a semiconductor substrate.

The semiconductor processing apparatus (the process chamber) 1 is usually provided with a conveyer for taking the work W in and out of the casing 10. In order to prevent the conveyer or the like from interfering with the heater plate 13, it is necessary to set the length of the shaft portion 14 to 10 mm or more, preferably 20 mm or more.

The work W is placed on the heater plate 13. The temperature, atmosphere, degree of vacuum or the like in the internal space of the casing 10 can be controlled by a controller (not shown) according to the processing of the work W. The inside of the casing 10 is maintained, for example, in a vacuum during processing of the work W. The surface use temperature of the heater plate 13 exceeds about 300° C. (573K); for example, it reaches 350° C. (623K).

The heater plate 13 includes a base member 21 made of aluminum alloy and a plate member 22 stacked on the base member 21. The base member 21 and the plate member 22 are joined together by soldering. The shaft member 14 is provided with a cylindrical shaft main portion 14a formed integrally with the base member 21 and a flange-like shaft bottom portion 14b. The shaft bottom portion 14b is formed at a lower portion of the shaft main portion 14a. A bottom face 14c of the shaft bottom portion 14b is fixed to a heater mounting portion 25 of the casing 10.

The shaft portion 14 has a length L of 20 to 50 mm and an outer diameter D of 20 to 200 mm. That is, the shaft portion 14 is a shaft portion of a short type with a length of 50 mm or less. The thickness t of the peripheral wall of the shaft main portion 14a is set to 0.5 to 5.0 mm. When the thickness t of the shaft portion 14 is less than 0.5 mm, the practical strength required for the shaft portion 14 cannot be achieved. On the other hand, when the thickness t exceeds 5.0 mm, the area of the heat-transfer surface becomes excessively large, so that the following thermal resistance $R_{th}$ cannot be achieved. Therefore, the thickness t should be set to 5.0 mm or less.

A sealing member 30 for sealing the shaft portion 14 and the casing 10 with each other is provided on the bottom face 14c of the shaft bottom portion 14b. One example of the sealing member 30 is a fluorine-containing heat-resistant O-ring. The maximum use temperature where the fluorine-containing heat-resistant O-ring can be used continuously is about 300° C. (573K).

The sealing member 30 is received in an annular seal groove 31 formed on the shaft bottom portion 14b. The seal groove 31 is formed concentrically with the shaft main portion 14a. Sealing between the shaft bottom portion 14b and the casing 10 is achieved by the sealing member 30. Air-tightness of the casing 10 can be maintained by the sealing member 30.

The shaft bottom portion 14b must be kept at a temperature of 300° C. or less during current flowing in the resistive heat generator 12 so as not to exceed the maximum temperature where the sealing member (the fluorine-containing O-ring) 30 can be continuously used. However, in such a constitution that the shaft bottom portion 14b is forcibly cooled by coolant, temperature unevenness occurs, which is not desirable. Therefore, it is desirable that the temperature at the shaft bottom portion 14b is reduced to 300° C. or less in the shaft portion 14 alone.

In view of these circumstances, the inventors of the present invention focus attention on the thermal resistance $R_{th}$ of the shaft portion 14. That is, in the heater unit 11 according to the embodiment, the temperature T1 of the shaft bottom portion 14b is suppressed to 300° C. or less by selecting the length L1 of the shaft main portion 14a, area of heat-transfer surface S thereof, and material therefore such that the thermal resistance $R_{th}$ of the shaft portion 14 becomes 0.4 or more. One example of the material for the shaft portion 14 is A6061 provided in JIS H4000. One example of the material for the plate member 22 is A1050.

The chemical components (weight percentage) of A6061 include Si of 0.40 to 0.8, Fe of 0.7 or less, Cu of 0.15 to 0.40, Mn of 0.15 or less, Mg of 0.8 to 1.2, Cr of 0.04 to 0.35, Zn of 0.25 or less, Ti of 0.15 or less, and Al for the remainder.

The chemical components (weight percentages) of A1050 include Si of 0.25 or less, Fe of 0.40 or less, Cu of 0.05 or less, Mn of 0.05 or less, Mg of 0.05 or less, Zn of 0.05 or less, Ti of 0.03 or less, and Al of 99.50 or more.

Figure 3:
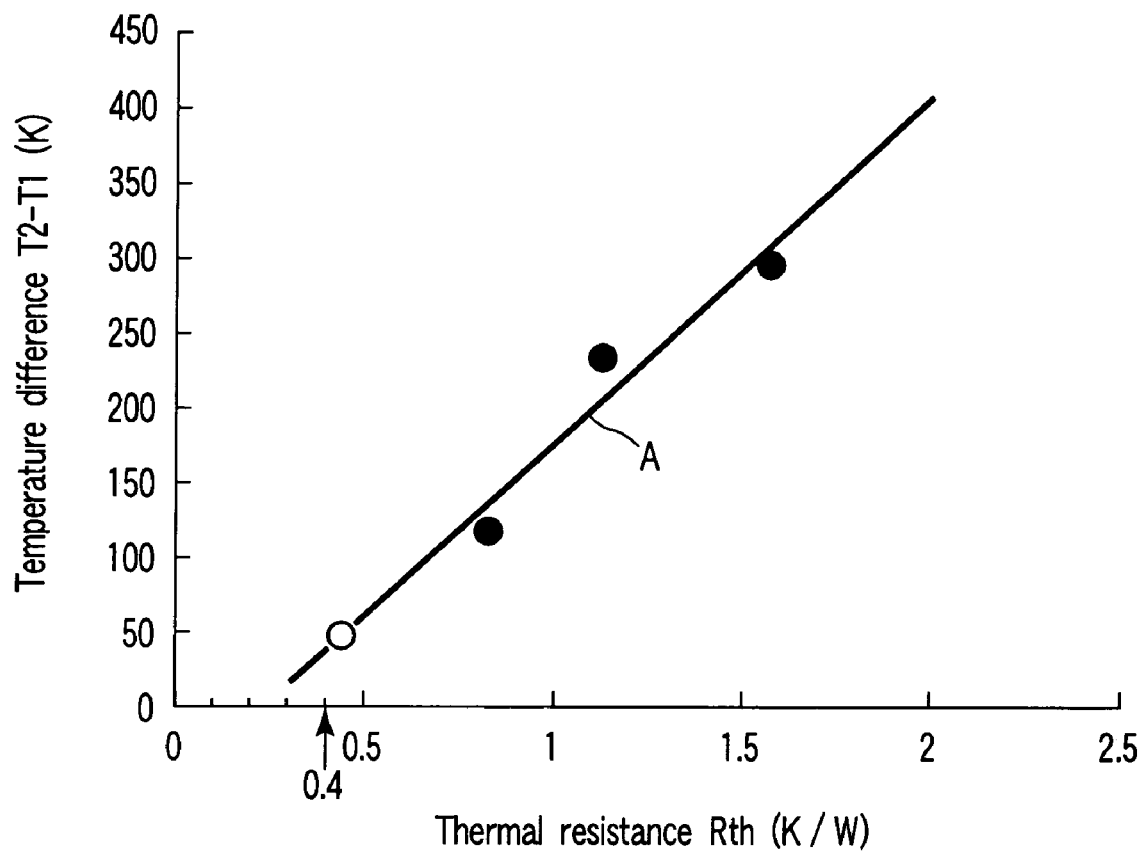
FIG. 3 is a graph showing the relationship between the thermal resistance $R_{th}$ of a shaft portion and the temperature difference (T2–T1)

FIG. 3 is a graph showing the results obtained by measuring the temperature difference (T2−T1) between the heater plate and the shaft bottom portion in heater units having three kinds of shaft portions whose thermal resistances $R_{th}$ are different from one another. Three black circles in FIG. 3 correspond to actually measured values. As shown with a line segment A in FIG. 3, it is understood from these values that there is a correlation between the thermal resistance $R_{th}$ and the temperature difference (T2−T1). That is, it has been found that the thermal resistance $R_{th}$ (K/W) of the shaft portion 14 greatly involves the temperature difference (T2−T1) as a parameter affecting the temperature difference.

The temperature difference (T2−T1) is expressed by the following equation (1). In the equation (1), q represents the heat flux transferred to the shaft portion 14, and $R_{th}$ represents the thermal resistance (K/W) of the shaft portion 14.

$$T2-T1 = q \times R_{th} \qquad (1)$$

When the length of the shaft portion 14 is represented as L (m), the area of heat-transfer surface of the shaft main portion 14a is represented as S (m²), and the coefficient of thermal conductivity (W/mK) is represented as λ, the thermal resistance $R_{th}$ is expressed by the following equation (2).

$$R_{th} = L/\lambda S \qquad (2)$$

The line section A based upon the actually measured values in FIG. 3 extends generally along the relationship [(T2−T1)=q×$R_{th}$] between the thermal resistance $R_{th}$ and the temperature difference (T2−T1). The slope of the line segment A increases according to increase of the heat flux q, and decreases according to decrease of the heat flux q. However, when the thermal resistance $R_{th}$ is 0.4 K/W or more, it is possible to set the temperature difference (T2−T1) to 35° C.

or more. In the semiconductor manufacturing process, a wafer is heated to a temperature of 335° C. or more by the heater plate 13. Thereby, T2 reaches a temperature of at least 335° C. Even in that case, when the temperature difference (T2−T1) is 35° C. or more, the temperature T1 of the shaft bottom portion can be reduced to 300° C. or less.

With reference to FIG. 3, in the heater unit 11 where the surface use temperature on the heater plate 13 is 350° C., when the thermal resistance $R_{th}$ of the shaft portion is set to 0.46 K/W or so (in a range of 0.40 to 0.50 K/W considering a tolerance), the temperature difference (T2−T1) becomes about 50° C., so that the shaft bottom portion can be set to 300° C. When the thermal resistance $R_{th}$ of the shaft portion is 1.00 K/W, the temperature difference (T2−T1) becomes 150° C. or more, so that the temperature of the shaft bottom portion can be further lowered.

As one example, a heater unit 11 where the length L1 of the shaft main portion 14a was 20 mm, the thickness t was 2.0 mm and the surface use temperature of the heater plate 13 was about 350° C. (623K) was examined. The target temperature of the shaft bottom portion 14b was 300° C. (573K) or less. In the sample product, when $R_{th}$ is 0.42 K/W, as shown with a while circle in FIG. 3, a desired temperature difference (T2−T1)=50° C. could be obtained. The material for the shaft portion 14 was aluminum alloy of A6061, whose coefficient of thermal conductivity λ was 180 (W/mK).

The heater unit 11 was manufactured by way of trial, and the temperature T1 (the temperature in the vicinity of the seal groove 31) of the shaft bottom portion 14b obtained when heating was performed up to the surface use temperature of the heater plate 13 of T2=350° C. (623 k) under a vacuum of 0.1 Torr or less was measured actually. As a result, T1=250° C. (523K) was obtained, and it was confirmed that the temperature was lowered to at least the maximum temperature (300° C.) where the sealing member 30 could be used continuously.

As a comparative example, a heater unit where the length L1 of the shaft portion 14 shown in FIG. 2 was 14 mm, the thickness t thereof was 2.0 mm, and the thermal resistance $R_{th}$ thereof was 0.3 K/W was manufactured by way of trial. In the trial product, the temperature T1 of the shaft bottom portion at a temperature of T2=350° C. (623K) was measured. The measuring condition was the same as that of the above-described thermal resistance $R_{th}$=0.42 K/W.

As the result obtained by measuring the temperature T1 of the trial product (the comparative example), when the temperature T2 was 350° C. (623K), the temperature T1 was 325° C. (598K) and the temperature difference (T2−T1) was 25° C. Further, when the temperature T2 was 335° C. (608K), the temperature T1 was 308° C. (581K) and the temperature difference (T2−T1) was 27° C. In both the cases, the temperature T1 exceeded the allowable temperature limit (300° C.) of the fluorine-containing sealing member.

With reference to FIG. 3, when the thermal resistance $R_{th}$ is 0.3 K/W, the temperature difference (T2−T1) is 15° C. Therefore, when the temperature T2 is 350° C. (623K), the temperature T1 becomes 335° C. (608K), so that the temperature of the shaft bottom portion exceeds the allowable temperature limit of the fluorine-containing sealing member. On the other hand, by setting the thermal resistance $R_{th}$ to 0.4 K/W or more (for example, 0.46 K/W), the temperature T1 can be reduced to 300° C. or less. The temperature difference (T2−T1) can be increased to 35° C. or more even at a temperature of 335° C., which is the minimum value of the temperature T2 required in the semiconductor manufacturing process. That is, the temperature T1 can be reduced to 300° C. or less.

Figure 4:
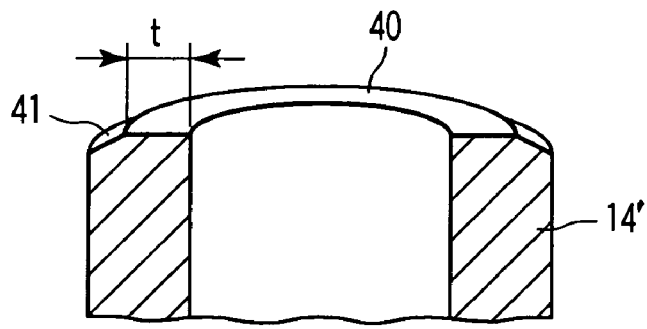
FIG. 4 is a perspective view showing, with a partial section, the end portion of a shaft portion according to a second embodiment of the invention.

FIG. 4 is a partial sectional view of a shaft portion 14' according to a second embodiment of the invention. The shaft portion 14' is formed on an outer periphery side of a joined portion 40 with the heater plate 13 (shown in FIG. 2), with a tapered portion 41 extending along the whole periphery thereof. The thickness t participating in the area of heat-transfer surface S is reduced by the tapered portion 41. With such a structure, the area of heat-transfer surface S is decreased without reducing the strength of the shaft portion 14', so that the thermal resistance $R_{th}$ can be increased. This embodiment is similar to the first embodiment in constitution except for the above constitution.

In implementation of the present invention, not only the heater plate but also the shaft portion, the sealing member, the casing and the like can be properly modified without departing from the gist of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A heater unit which is accommodated inside a casing having a heater mounting portion, comprising:
    a heater plate which is provided with a heat generator;
    a hollow shaft portion of a short type with a length of 50 mm or less, which is disposed between a lower face of the heater plate and the heater mounting portion, a bottom face of the shaft portion being fixed to the heater mounting portion, a thickness of a peripheral wall of the shaft portion being 0.5 to 5.0 mm, and a length, an area of heat-transfer surface, and a material of the shaft portion being selected such that a thermal resistance $R_{th}$ of the shaft portion is 0.4 K/W or more; and
    a sealing member which seals the bottom face of the shaft portion and the heater mounting portion with each other.

2. A heater unit according to claim 1, wherein the thermal resistance $R_{th}$ of the shaft portion is 0.42 (K/W) or more.

3. A heater unit according to claim 1, wherein the sealing member is a fluorine-containing heat-resistant O-ring.

4. A heater unit according to claim 2, wherein the sealing member is a fluorine-containing heat-resistant O-ring.

5. A heater unit according to claim 1, wherein a material of the shaft portion is aluminum alloy.

6. A heater unit according to claim 2, wherein a material of the shaft portion is aluminum alloy.

7. A heater unit according to claim 3, wherein a material of the shaft portion is aluminum alloy.

8. A heater unit according to claim 4, wherein a material of the shaft portion is aluminum alloy.

* * * * *